US010249716B1

(12) United States Patent
Seok et al.

(10) Patent No.: US 10,249,716 B1
(45) Date of Patent: Apr. 2, 2019

(54) IGBT ASSEMBLY HAVING SATURABLE INDUCTOR FOR SOFT LANDING A DIODE RECOVERY CURRENT

(71) Applicant: IXYS, LLC, Milpitas, CA (US)

(72) Inventors: Kyoung Wook Seok, Milpitas, CA (US); Joseph James Roosma, Santa Clara, CA (US)

(73) Assignee: IXYS, LLC, Milpitas, CA (US)

( * ) Notice: Subject to any disclaimer, the term of this patent is extended or adjusted under 35 U.S.C. 154(b) by 0 days.

(21) Appl. No.: 15/698,556

(22) Filed: Sep. 7, 2017

Related U.S. Application Data (63) Continuation of application No. 13/134,297, filed on Jun. 2, 2011, now Pat. No. 9,793,352.

(51) Int. Cl.
*H01L 29/66* (2006.01)
*H01L 29/10* (2006.01)

(52) U.S. Cl.
CPC ................................ *H01L 29/1095* (2013.01)

(58) Field of Classification Search
CPC .................................................. H01L 29/1095
USPC ........................................................ 257/497
See application file for complete search history.

(56) References Cited

U.S. PATENT DOCUMENTS

| 3,798,059 | A | * | 3/1974 | Astle | ...................... H01F 1/0027 336/229 |
| 4,030,998 | A | | 6/1977 | Barrault | ........................ 204/219 |
| 4,392,172 | A | | 7/1983 | Foley et al. | ....................... 361/8 |
| 4,707,619 | A | * | 11/1987 | Chu | ........................ H01F 38/18 307/106 |
| 5,761,040 | A | | 6/1998 | Iwasa et al. | ................... 361/704 |
| 5,793,272 | A | | 8/1998 | Burghartz et al. | ............. 336/200 |
| 6,058,028 | A | | 5/2000 | Czerwinski | ...................... 363/44 |
| 2004/0004525 | A1 | | 1/2004 | Rittner et al. | ................. 336/200 |
| 2005/0073281 | A1 | | 4/2005 | Kerlin et al. | .................. 318/749 |
| 2008/0029907 | A1 | | 2/2008 | Koduri | .......................... 257/784 |
| 2009/0194859 | A1 | | 8/2009 | Kang et al. | ................... 257/676 |
| 2009/0206812 | A1 | | 8/2009 | Sasaya et al. | ................ 323/282 |
| 2011/0018136 | A1 | * | 1/2011 | Bedair | ...................... H05K 1/16 257/773 |

OTHER PUBLICATIONS

Abdus Sattar, "Insulated Gate Bipolar Transistor (IGBT) Basics", date unknown, downloaded May 31, 2011, pp. 1-15.
Jonathan Dodge, "Latest Technology PT IGBTs vs. Power MOSFETs", Application Note, APT0302 Rev. A, Apr. 4, 2003, pp. 1-6.

\* cited by examiner

Primary Examiner — Ajay Arora

(57) ABSTRACT

A combination switch includes an Insulated Gate Bipolar Transistor (IGBT), an anti-parallel diode, and a saturable inductor. The diode and inductor are coupled in series between a collector and an emitter of the IGBT. The inductor is fashioned so that it will come out of saturation when a forward bias current flow through the diode falls below a saturation current level. When the diode current falls (for example, due to another combination switch of a phase leg turning on), the diode current initially falls at a high rate until the inductor current drops to the saturation current level. Thereafter, the diode current falls at a lower rate. The lower rate allows the diode current to have a soft landing to zero current, thereby eliminating or reducing voltage and/or current spikes that would otherwise occur. Multiple methods of implementing and manufacturing the saturable inductor are disclosed.

19 Claims, 10 Drawing Sheets

NOVEL COMBINATION SWITCH
WITH A SATURABLE INDUCTOR
AND A SMALLER SNUBBER (PRIOR ART)

FIG. 1

ONE LEG WITH THE LOAD MODELED
AS A CONSTANT CURRENT SOURCE (PRIOR ART)

FIG. 2

EMI PROBLEM IF THE BOTTOM SWITCH IS TURNED ON TOO ABRUPTLY

(PRIOR ART)

FIG. 3

COMBINATION SWITCH

FIG. 4

AN APPLICATION OF THE COMBINATION SWITCH

CONVENTIONAL
COMBINATION SWITCH
WITH A LARGE SNUBBER
(PRIOR ART)
FIG. 7

NOVEL COMBINATION SWITCH
WITH A SATURABLE INDUCTOR
AND A SMALLER SNUBBER
FIG. 8

SOFT LANDING OF RECOVERY CURRENT
FIG. 9

SATURABLE INDUCTOR

FIG. 10

I/V CHARACTERISTIC OF A SATURABLE INDUCTOR

FIG. 11

SATURABLE
INDUCTOR (PERSPECTIVE VIEW)

FIG. 12

SATURABLE
INDUCTOR

(SIDE VIEW)

FIG. 13

IGBT ELECTRONIC DEVICE BEFORE OVERMOLDING

FIG. 14

IGBT ELECTRONIC DEVICE BEFORE OVERMOLDING
FIG. 15

PACKAGED IGBT ELECTRONIC DEVICE
FIG. 16

IGBT ASSEMBLY HAVING SATURABLE INDUCTOR FOR SOFT LANDING A DIODE RECOVERY CURRENT

CROSS REFERENCE TO RELATED APPLICATIONS

This application is a continuation of, and claims priority under 35 U.S.C. § 120 from, nonprovisional U.S. patent application Ser. No. 13/134,297 entitled "IGBT Assembly Having Saturable Inductor For Soft Landing A Diode Recovery Current," filed on Jun. 2, 2011, now U.S. Pat. No. 9,793,352, the subject matter of which is incorporated herein by reference.

TECHNICAL FIELD

The described embodiments relate to Insulated Gate Bipolar Transistors (IGBTs).

BACKGROUND INFORMATION

The combination of an Insulated Gate Bipolar Transistor (IGBT) and an anti-parallel diode is a circuit that sees use in many power electronics circuits. The diode often used is referred to as a Fast Recovery Diode (FRD) or a Fast Recovery Epitaxial Diode (FRED). The diode is coupled between the collector and the emitter of the IGBT in the anti-parallel direction. The IGBT may be a Punch Through type IGBT (PT IGBT) or a Non-Punch Through type IGBT (NPT IGBT).

Figure 1:
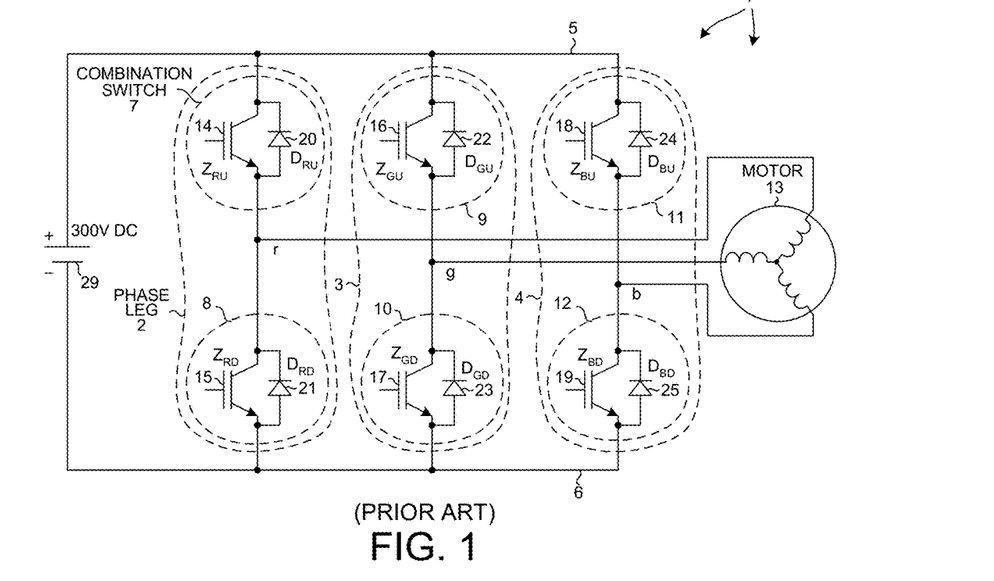
FIG. 1 (Prior Art) is a diagram of a motor drive application of a conventional IGBT combination switch.

FIG. 1 (Prior Art) is a simplified diagram of one such application of an IGBT/diode combination circuit. The circuit is a three-phase motor drive circuit 1 that has three phase legs 2, 3 and 4. Each phase leg is coupled between a first DC voltage conductor 5 and a second DC voltage conductor 6. In the illustrated example, a 300 volt DC voltage is present between conductors 5 and 6. The battery symbol 29 is not typically a battery. In the specific circuit illustrated here, symbol 29 represents a three-phase AC rectification circuit that converts three-phase AC power into a 300 volt DC voltage. Each of the three legs 2, 3 and 4 includes two combination switches as illustrated. One of the combination switches of the leg is for coupling an output node of the leg to the first DC voltage conductor 5, whereas the other combination switch of the leg is for coupling the output node of the leg to the second DC voltage conductor 6. Leg 2 includes combination switches 7 and 8. Leg 3 includes combination switches 9 and 10. Leg 4 includes combination switches 11 and 12. The IGBTs are designated with reference numerals 14-19, and the diodes are designated with reference numerals 20-25.

The three windings of a motor 13 are coupled to the corresponding three output nodes r, g and b of the three legs. The gates of the IGBTs are driven as known in the art to rotate the motor as desired. The ON/OFF duty cycles of the IGBTs determine the time averaged voltages at the output nodes r, g and b. In order to prevent the circuit from generating audible noise, the switching frequency of the IGBTs is generally made to be higher than 15 kHz. In many cases, the motor windings are so highly inductive that the output currents change very slowly compared to the >15 kHz switching frequency. The motor load on a leg can therefore be considered to be a constant current source as compared to the switching on and off of the IGBT.

Figure 2:
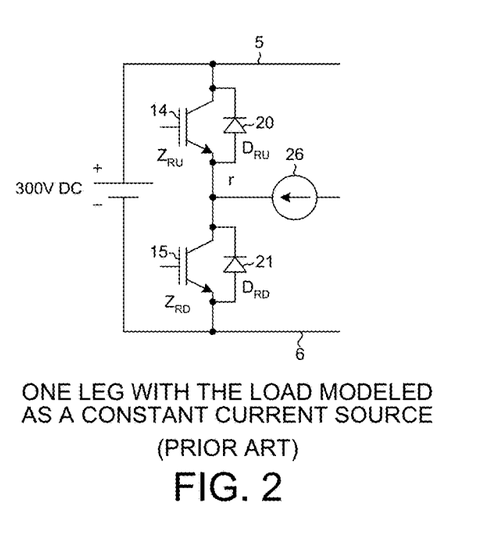
FIG. 2 (Prior Art) is a diagram of one phase leg of the motor drive circuit of FIG. 1 with the load of the motor modeled as a current source.

FIG. 2 (Prior Art) is a diagram of leg 2 with the inductive load of motor 13 being represented as a current source 26. Prior to IGBT 15 being turned on, current flows from current source 26, to output node r, and then up through diode 20, and to conductor 5. IGBT 14 is off. When IGBT 15 is turned on and starts flowing current, there is a corresponding decrease in the current flow through diode 20. If the rate of increase in current through IGBT 15 is high, then voltage and current spikes can result.

Figure 3:
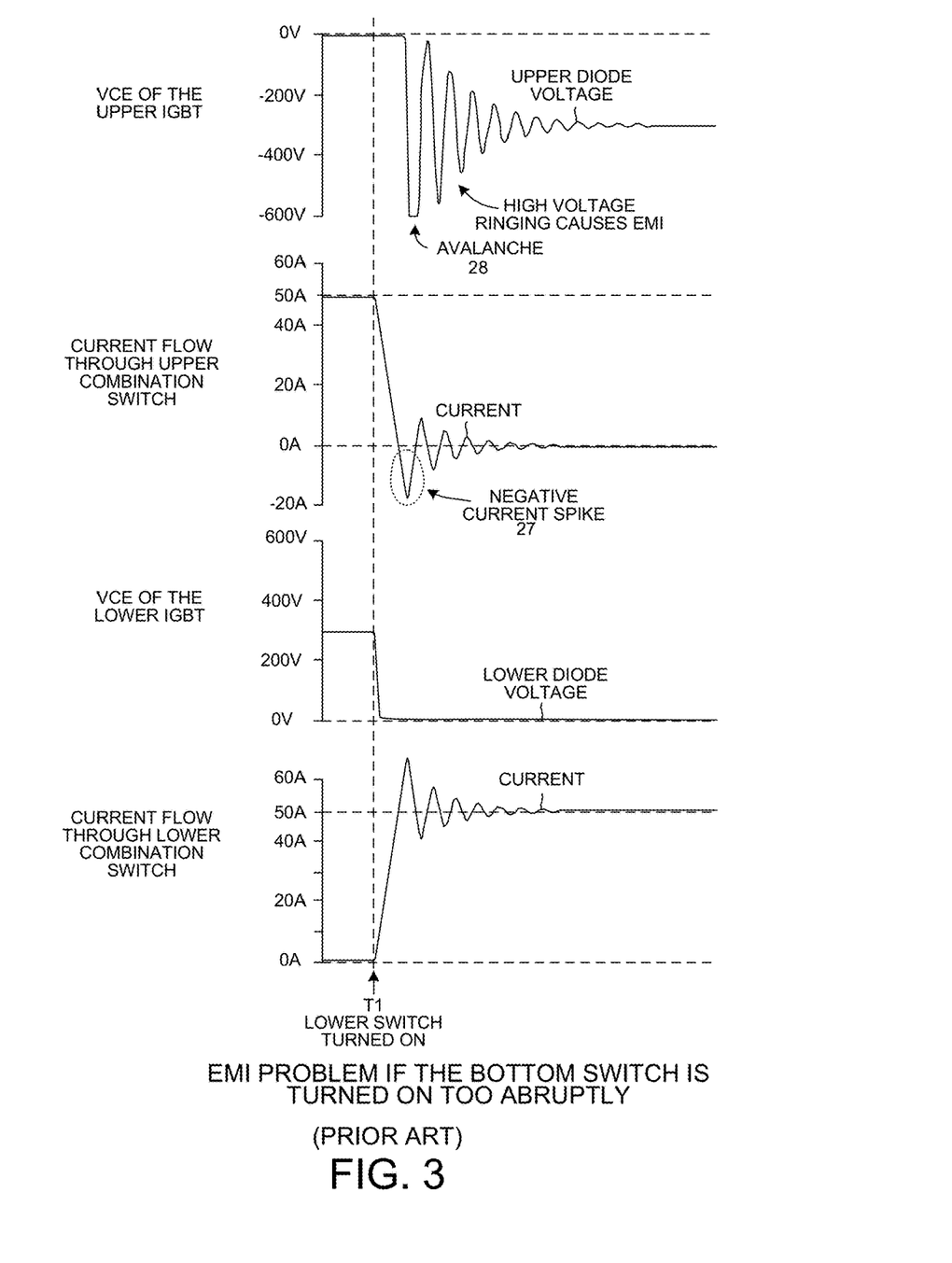

FIG. 3 (Prior Art) is a waveform diagram that illustrates ringing that might occur when IGBT 15 of FIG. 2 is turned on. Initially, the current from modeled current source 26 passes through node r, then through forward biased diode 20, and up to conductor 5. Then, at time T1, the lower IGBT 15 is turned on. The total amount of current being supplied onto node r remains substantially constant due to current source 26. Therefore, when current begins flowing through lower IGBT 15, there is a commensurate decrease in current flow through upper diode 20. If the rate of change of current flow through the lower IGBT is rapid (a large negative dI/dt), then the corresponding high rate of falling current in the diode 20 may result in overshoot and a negative current spike 27.

The rapid decrease in the current in the upper leg can result in a corresponding voltage spike across the upper IGBT as indicated by the upper waveform. If the decrease in diode current in the upper leg is rapid enough, then the voltage drop across the upper diode 20 may be so large that diode 20 will experience avalanche breakdown. In the diagram of FIG. 3, the flat bottom portion 28 of the first voltage oscillation after time T1 in the upper waveform is due to avalanche breakdown of diode 20. The subsequent high amplitude ringing of the voltage on node r damps out as illustrated, but the short duration of the high voltage ringing is problematical. First, many designers of power electronics circuits may simply not want to design products that operate with such large voltages. Their reasons may involve reliability concerns and/or safety concerns. Second, the high amplitude voltage ringing may result in undesired amounts of electromagnetic radiation being emitted. This unwanted emitted electromagnetic radiation causes Electro-Magnetic Interference (EMI). The rate at which current flow through diode 20 is made to decrease may be reduced to prevent such high voltage ringing on node r, but decreasing the rate of current change through IGBT 15 translates into increased energy losses. It is desired to be able to switch the IGBT quickly for efficiency reasons, and yet to produce no large voltage spikes and to emit little electromagnetic radiation.

SUMMARY

A combination switch includes a Punch Through type Insulated Gate Bipolar Transistor (PT IGBT), an anti-parallel diode, and a saturable inductor. The diode and saturable inductor are coupled in series in a current path between a collector electrode of the IGBT and an emitter electrode of the IGBT. In one example, the IGBT and the diode are mounted directly on a heat sink portion of a stamped metal lead frame. The saturable inductor is disposed on the diode. An emitter lead is wire bonded to the saturable inductor and to an emitter electrode of the IGBT. A gate lead is wire bonded to a gate electrode of the IGBT. The IGBT, the diode, the saturable inductor, and the wire bonds are overmolded with an amount of encapsulant, thereby forming a packaged IGBT electronic device. The combination switch can be assembled and packaged in this way as a single combination switch, or as one of a pair of combination switches in the form of a phase leg, or as part of a larger electronic device.

In one example, the IGBT has a maximum continuous collector-to-emitter current. The saturable inductor is sized and fashioned so that it will come out of saturation when current flow through the saturable inductor falls to a saturation current level. This saturation current level is substantially smaller than (for example, less than half of) the maximum continuous collector-to-emitter current and is preferably a current level slightly above zero amperes. In some examples, however, the saturation current level is a current level that is slightly below zero amperes.

In an application where the combination switch is used as the upper combination switch in a phase leg along with another identical combination switch (the lower combination switch), the lower combination switch may initially be off and not conducting current. During this time, a current may flow from an output node of the phase leg, and then through the forward biased diode of the upper combination switch. When the lower combination switch is then made to turn on, the current flow through the forward biased diode of the upper combination switch decreases. This current decreases during a first period of time at a first relatively rapid rate (a relatively large negative dI/dt) until the current flow through the saturable inductor has dropped to the saturation current level. When the current level has dropped to the saturation current level, then the saturable inductor comes out of saturation. The inductance of the saturable inductor increases due to the saturable inductor no longer being saturated, and the subsequent decrease of diode current proceeds during a second period of time at a second relatively smaller rate (a relatively small negative dI/dt). The decreased rate of diode current flow during this second period of time allows the diode current to have what is referred to here as a "soft landing" to zero amperes. The soft landing reduces or eliminates high voltage and current spikes that would otherwise occur if a conventional combination switch were used for the combination switches of the leg.

There are many ways that the saturable inductor of the combination switch can be realized. In a first example, the saturable inductor is a surface mountable wound inductor structure that is mounted on top of the diode integrated circuit. A bottom conductive layer of the inductor structure is solder-mounted to the planar top of the underlying diode integrated circuit. An upper conductive layer of the inductor structure is wire bonded to the emitter lead of the packaged device. The surface mount inductor structure can be a toroidal inductor. In a second example, the saturable inductor is formed by depositing a volume of a liquid bonding agent so that the bonding agent surrounds the emitter bond wire at the location where the emitter bond wire attaches to the top of the diode integrated circuit. The volume of liquid bonding agent contains an amount of ferromagnetic particles. The liquid bonding agent then solidifies to form an inductor structure in which the ferromagnetic particles are held in place with respect to the emitter bond wire by the solidified bonding agent. The emitter bond wire and the solidified bonding agent containing ferromagnetic particles together form the saturable inductor. The method of making an inductor using a volume of curable liquid bonding agent and ferromagnetic particles sees special use in making IGBT electronic devices, but is also of general utility in the electronic arts outside the fields of IGBTs and power electronics.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 3 (Prior Art) is a waveform diagram that illustrates ringing that might occur when an IGBT of the motor drive circuit of FIG. 1 is switched on.

DETAILED DESCRIPTION

Reference will now be made in detail to background examples and some embodiments of the invention, examples of which are illustrated in the accompanying drawings.

Figure 4:
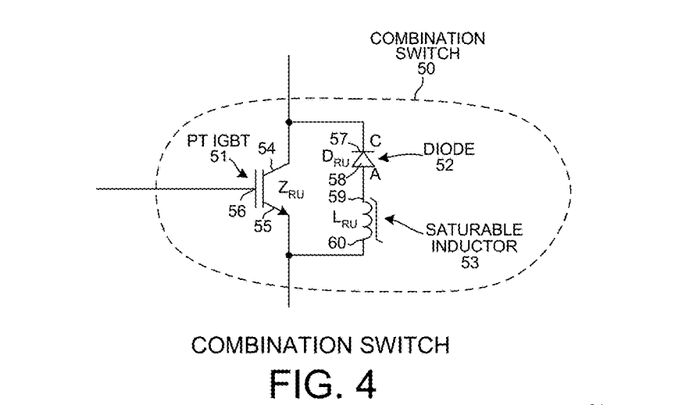
FIG. 4 is a diagram of a combination switch involving a saturable inductor in accordance with one novel aspect.

FIG. 4 is a diagram of a combination switch 50 in accordance with one novel aspect. Combination switch 50 includes a Punch Through type Insulated Gate Bipolar Transistor (PT IGBT) 51, a fast recovery diode 52, and a saturable inductor 53. Diode 52 and saturable inductor 53 are connected together in series between a collector electrode 54 of IGBT 51 and an emitter electrode 55 of IGBT 51. Reference numeral 56 identifies a gate electrode of IGBT 51. In the illustrated example, IGBT 51 is an N-type PT IGBT. The cathode 57 of diode 52 is coupled to the collector 54 of IGBT 51. The anode 58 of diode 52 is coupled to a first end or lead 59 of inductor 53. A second lead or end 60 of inductor 53 is coupled to the emitter 55 of IGBT 51.

Figure 5:
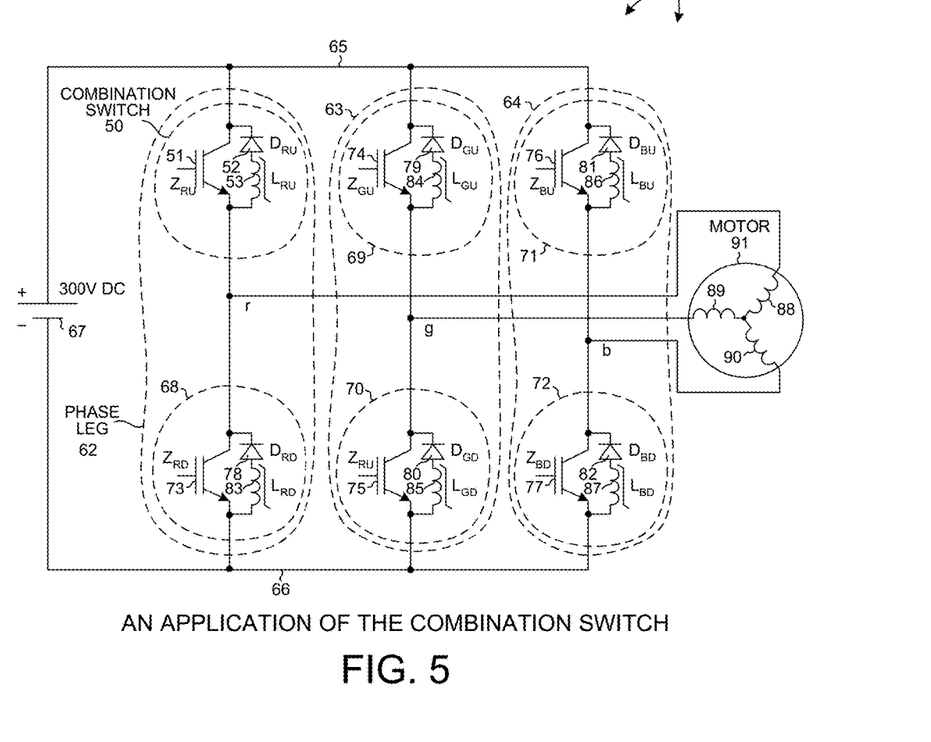
FIG. 5 is a diagram of a motor drive circuit that employs the novel combination switch of FIG. 4.

FIG. 5 is a diagram of an application of the novel combination switch 50 of FIG. 4. The application is a three-phase motor drive circuit 61 that has three phase legs 62, 63 and 64. Each leg is coupled between a first DC voltage conductor 65 and a second DC voltage conductor 66. In the illustrated example, a 300 volt DC voltage is present between conductors 65 and 66. The battery symbol 67 is not typically a battery. In one example, symbol 67 represents a power supply circuit that receives AC power and that outputs the indicated 300 volt DC voltage. Each of the three legs 62, 63 and 64 includes two of the combination switches of FIG. 4 as illustrated. All of the combination switches 50 and 68-72 are of identical construction. Combination switch 50 of FIG. 4 is the same combination switch 50 illustrated in FIG. 4.

One of the combination switches of each leg is for coupling an output node of the leg to the first DC voltage conductor 65, whereas the other combination switch of the leg is for coupling the output node of the leg to the second DC voltage conductor 66. Leg 62 includes combination switches 50 and 68. Leg 63 includes combination switches 69 and 70. Leg 64 includes combination switches 71 and 72. The IGBTs are designated with reference numerals 51 and 73-77. The diodes are designated with reference numerals 52 and 78-82. The saturable inductors are designated with reference numerals 53 and 83-87.

Three windings 88-90 of a motor 91 are coupled to the corresponding three output nodes r, g and b of the three legs 62, 63 and 64, respectively. The gates of the IGBTs are driven by control circuitry (not shown) as known in the art to rotate the motor as desired. The ON/OFF duty cycles of the IGBTs determine the time averaged voltages at the output nodes r, g and b. In order to prevent the motor drive circuit 61 from generating audible noise, the switching frequency of the IGBTs is generally made to be higher than 15 kHz. In many cases, the windings of the motor are so highly inductive that the current flows into and out of the output nodes of the legs change very slowly compared to the >15 kHz switching frequency.

Figure 6A:
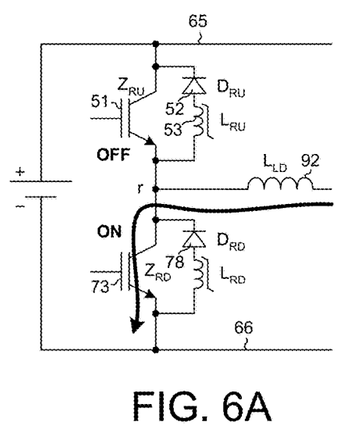
FIGS. 6A-6G together are a sequence of diagrams that illustrates various points in an operation of a phase leg of the motor drive circuit of FIG. 5.

FIGS. 6A-6G together are a sequence of diagrams that illustrates various points in an operation of the phase leg 62 of FIG. 5. Reference numeral 92 represents the inductive load of the motor 91 and is considered to act as a current source during the short time intervals represented in the diagrams of FIGS. 6A-6G. During a first period of time, as represented by FIG. 6A, IGBT 73 is on. Current flows from the motor 91, through node r, and through conductive IGBT 73, to ground conductor 66 as shown.

Figure 6B:
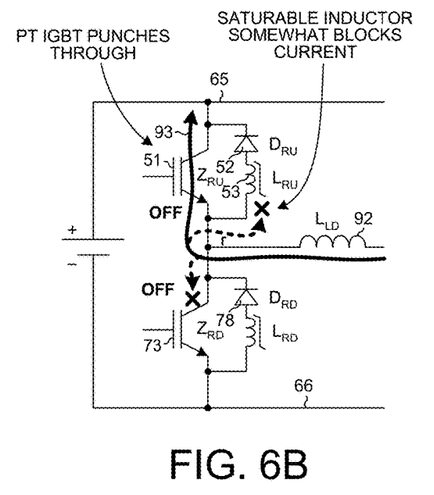

Next, as indicated in FIG. 6B, IGBT 73 is turned off. The large inductance 92 of the motor load, however, maintains current flow. To the extent that turning off IGBT 73 reduces current flow from node r to ground conductor 66, there is a corresponding increase in current flow from node r and up through the upper combination switch 50. The saturable inductor 53 of the upper combination switch, however, somewhat blocks an abrupt surge of current due to its inductance. This blocking of current flow is schematically represented in FIG. 6B by the heavy "X". The voltage on node r therefore rises. IGBT 51 is a punch through type IGBT. The punch through IGBT 51 has two avalanche breakdown voltages. One is a collector-to-emitter breakdown voltage that is several hundred volts to several thousand volts. The other is an emitter-to-collector voltage. PT IGBT 51 has this avalanche breakdown voltage at around 25 volts, while an NPT IGBT would have an emitter-to-collector breakdown voltage similar to the collector-to-emitter breakdown voltage. PT IGBT 51 can be any suitable type of PT IGBT such as a planar IGBT or a trench IGBT that has an N+ type buffer region in contact with a P++ type substrate. In the situation of FIG. 6B, the voltage on node r rises until the voltage is more than the emitter-to-collector breakdown voltage. Current (sometimes referred to as "punch through current") then flows as indicated by arrow 93 from node r, through IGBT 51, and to conductor 65.

Figure 6C:
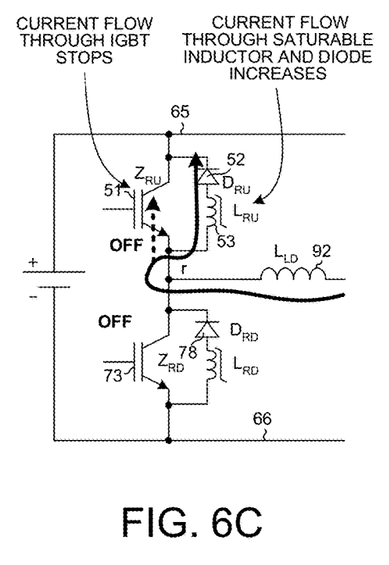

FIG. 6C shows circuit operation at a subsequent time. Current flow through saturable inductor 53 increases and the punch through current flow through PT IGBT 51 decreases until it stops. The current flow up through the saturable inductor 53 and the diode 52 to conductor 65 becomes so large that saturable inductor 53 saturates. This condition with the two IGBTs 51 and 73 off persists for a period of time.

Figure 6D:
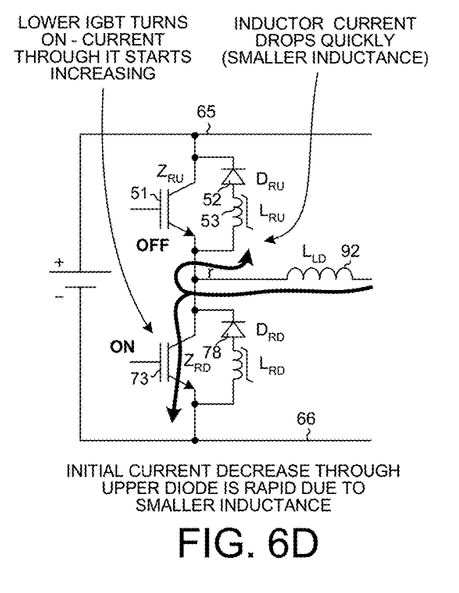

Next, as illustrated in FIG. 6D, the IGBT 73 of the lower combination switch is turned on. The large inductance 92 of the load causes the current flow into node r to remain substantially constant during the turn on of IGBT 73. Therefore, as current begins to flow from node r and down through IGBT 73 and to ground conductor 66, there is a commensurate decrease in the flow of current from node r and up through saturable inductor 53 and diode 52 to conductor 65. Due to the high current conditions of FIG. 6C and FIG. 6D, the saturable inductor is, however, still saturated. Its inductance is a relatively small inductance due to its being saturated and consequently the inductor does not substantially impede the reduction in current flow through the diode and saturable inductor as IGBT 73 turns on. The magnitude of the diode and saturable inductor current therefore decreases rapidly at a first relatively large rate (large negative dI/dt) while the saturable inductor is saturated. Current increases in the lower IGBT 73 and decreases in the current path through inductor 53 and diode 52. At some point, the magnitude of current flow through the saturable inductor 53 drops below a saturation current level. When the current flow drops below the saturation current level then saturable inductor 53 comes out of saturation. The inductor 53 coming out of saturation results in the inductance of the saturable inductor increasing. This increase in inductance serves to decrease the rate at which the current decreases.

Figure 6E:
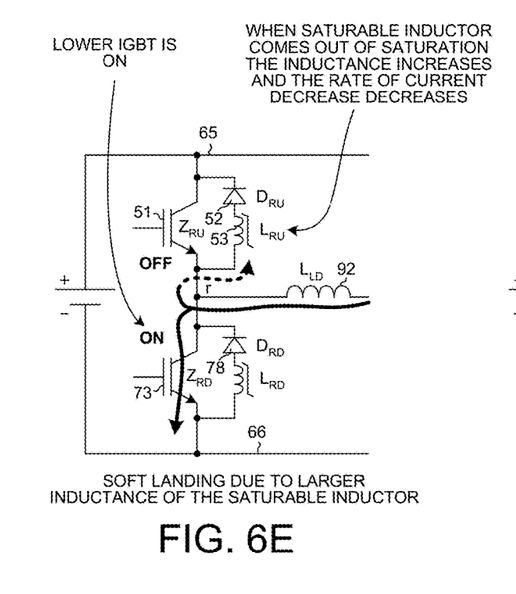

FIG. 6E represents the slower rate of current decrease (a smaller negative dI/dt) flowing through diode 52 and inductor 53 due to inductor 53 being desaturated. A continued decrease in current through diode 52 and inductor 53 causes the current to become a negative current.

Figure 6F:
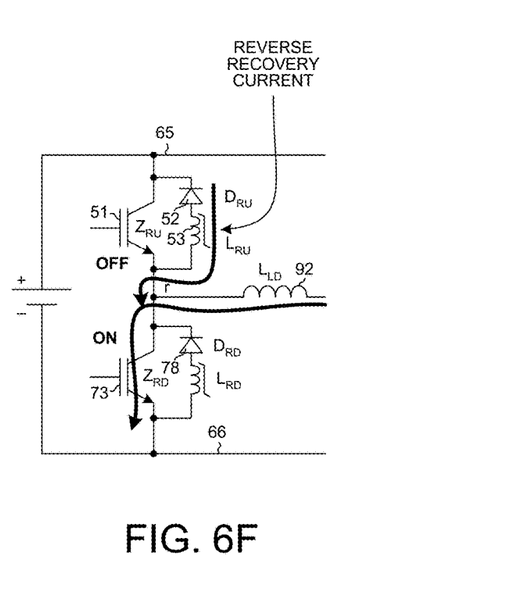

FIG. 6F illustrates the condition in which the current through diode 52 and inductor 53 is a negative current. The negative current flow may be referred to as "reverse recovery current". In a short amount of time the transient condition of the reverse recovery current is over and current flow through diode 52 and inductor 53 reaches and stays at zero amperes.

Figure 6G:
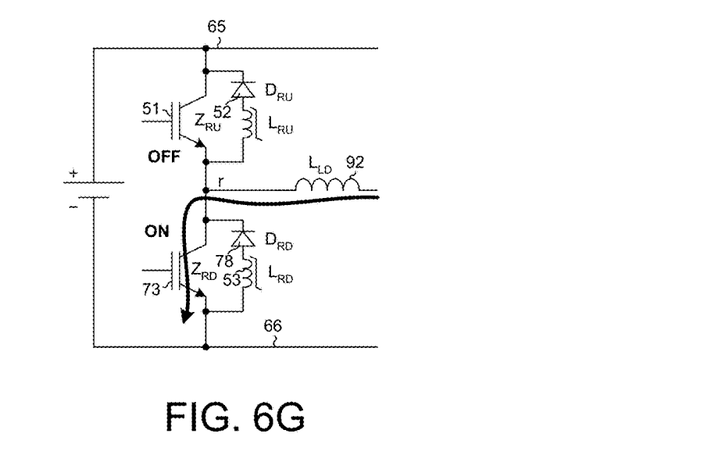

FIG. 6G illustrates the resulting condition. Substantially all current flowing from the load at this point flows through node r and then through conductive IGBT 73 and to ground conductor 66. Rather than the diode and inductor current decreasing rapidly throughout the entire time during which IGBT 73 is switched such that a negative current spike occurs as illustrated in FIG. 3 (Prior Art), in the sequence of FIGS. 6A-6G the diode and inductor current decreases rapidly at a larger dI/dt for a period of time until the inductor desaturates, at which point the rate of decrease of the diode and inductor current (dI/dt) is lessened for a subsequent period of time. The resulting current waveforms of the diode and inductor current can be said to exhibit a "soft landing" to zero current. High voltage ringing due to the negative current spike 27 of FIG. 3 (Prior Art) is therefore reduced or avoided. Switching efficiency is not unduly compromised because the overall amount of time required to go from the condition of FIG. 6D to the condition of FIG. 6G is relatively small. The rate of decrease of the diode and inductor current is rapid for most of the time that the current is increasing in the lower IGBT. The overall duration of switching is therefore not substantially increased.

Figure 7:
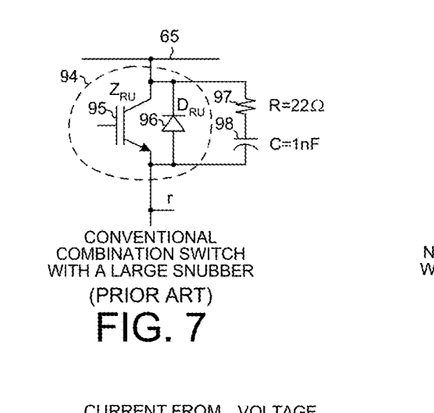
FIG. 7 (Prior Art) is a diagram of a conventional combination switch in parallel with a large snubber.

FIG. 7 is a diagram of a conventional combination switch 94 involving an IGBT 95 and an anti-parallel diode 96. An RC snubber involving a resistor 97 and a capacitor 98 is coupled in parallel with the IGBT 95 between the IGBT collector and the IGBT emitter. Conventionally, a snubber is sometimes employed to prevent high voltage transients during switching. In the example, the snubber is a large one with the resistor 97 having a resistance of 22 ohms and the capacitor 98 having a capacitance of 1.0 nanofarads.

Figure 8:
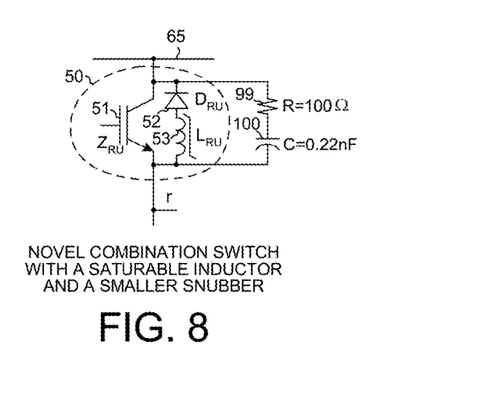
FIG. 8 is a diagram of the novel combination switch of FIG. 4 in parallel with a small snubber.

FIG. 8 is a diagram of the novel combination switch 50 of FIG. 4 involving IGBT 51, diode 52, and saturable inductor 53. An RC snubber involving a resistor 99 and a capacitor 100 is coupled in parallel with the IGBT 51 between the IGBT collector and the IGBT emitter. In the example, the snubber is a small one with the resistor 99 having a resistance of 100 ohms and the capacitor 100 having a capacitance of 0.22 nanofarads.

Figure 9:
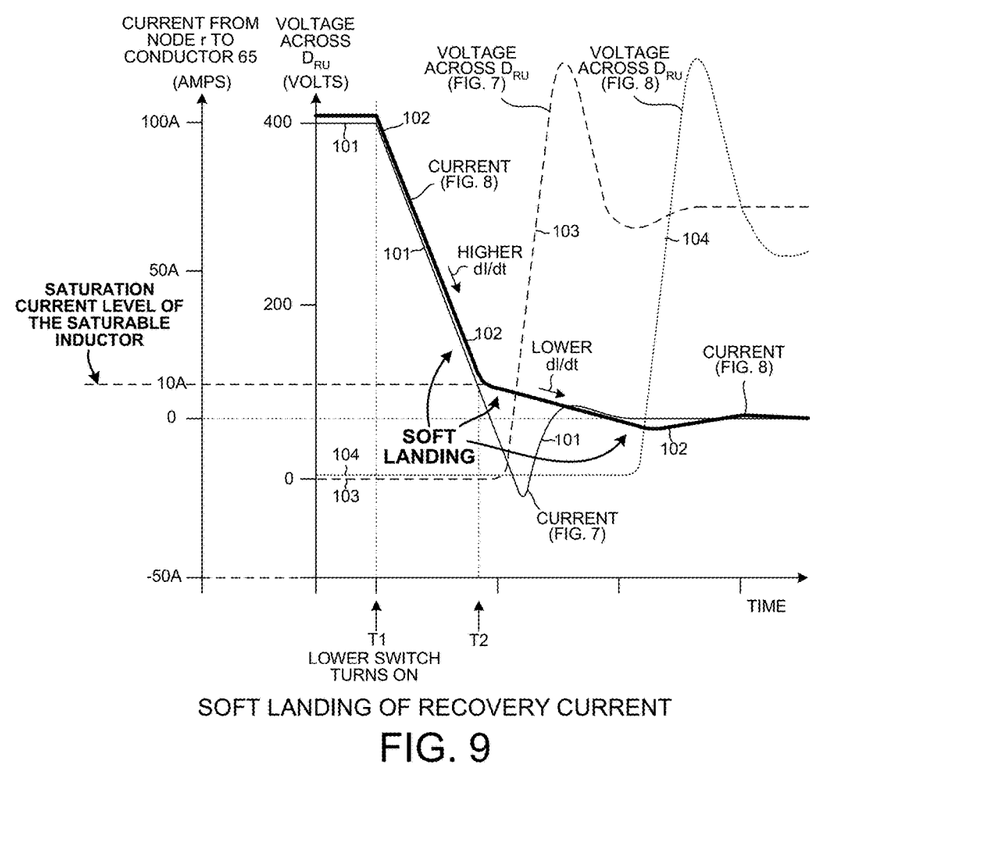
FIG. 9 is a waveform diagram that sets forth simplified simulation results of simulating the circuits of FIG. 7 and FIG. 8. It is to be understood that the waveform diagram is a simplification. For a more detailed and accurate understanding of circuit operation, the actual detailed circuit can be built and tested and/or simulated using a circuit simulator such as SPICE.

FIG. 9 is a waveform diagram that sets forth simulation results of simulating the circuits of FIG. 7 and FIG. 8. The circuits of FIG. 7 and FIG. 8 are simulated to be the upper combination switch in a leg. Initially, current is flowing from the load, into the output node of the leg, and then up through the diode of the upper combination switch. The current scale of FIG. 9 is for current flow from the output node of the leg and up through the circuits of FIG. 7 and FIG. 8, and to conductor 65. Then at time T1 the lower combination switch of the leg (not shown) is turned on, thereby causing a rapid decrease in the diode current of the upper combination switch. Waveform 101 (the thin solid line in FIG. 9) represents current flow from node r to conductor 65 in the conventional circuit of FIG. 7. Waveform 102 (the heavy solid line in FIG. 9) represents current flow from node r to conductor 65 in the novel circuit of FIG. 8. In both cases, current through the diode initially decreases at a first relatively rapid rate (large negative dI/dt) as the simulated lower IGBT of the leg turns on. In the case of the conventional circuit of FIG. 7, however, the decrease in diode current continues at the large rate past time T2. The diode current then goes negative (below zero amperes) to a substantial degree. Current and voltage ringing results. Waveform 103 represents the voltage across diode 96 in FIG. 7 in a condition of the large snubber of resistor 97 and capacitor 98.

In the case of the novel circuit of FIG. 8, however, diode current decreases initially at the high rate (large negative dI/dt) from time T1 to time T2, but at time T2 current flow through the saturable inductor 53 falls below the saturation current level. The saturable inductor 53 comes out of saturation, which causes the inductance of saturable inductor 53 to increase, and this causes the subsequent decrease in the rate of diode current to be smaller (a smaller negative dI/dt from time T2 onward. This accomplishes the "soft landing" of the recovery current to zero amperes as described above. A large negative current undershoot does not occur. Waveform 104 represents the voltage across diode 52 in FIG. 8 in a condition of the small snubber of resistor 99 and capacitor 100. Although the voltage spiking represented by waveform 104 appears to be as severe as the voltage spiking represented by waveform 103, it is to be remembered that the RC snubber provided in the circuit of FIG. 8 is much smaller than the RC snubber provided in the circuit of FIG. 7. Simulation results of circuits using snubbers of different sizes are presented in FIG. 9 for comparison purposes so that both voltage waveforms can be shown effectively on the same voltage scale. In an actual high-speed switching circuit implementation of the combination switch of FIG. 4, it is likely that no snubber will need to be provided and this is considered to be a significant improvement over conventional combination switches where snubbers are typically required to prevent unwanted high voltage spikes and/or electromagnetic radiation.

Figure 10:
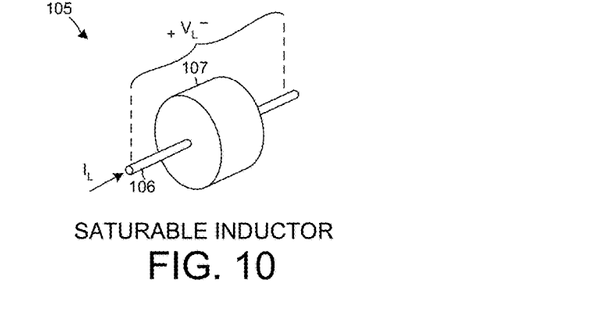
FIG. 10 is perspective diagram of an inductor.

FIG. 10 is a simplified perspective diagram of an inductor 105. Inductor 105 involves a conductor 106 that extends through a volume of a ferromagnetic material 107.

Figure 11:
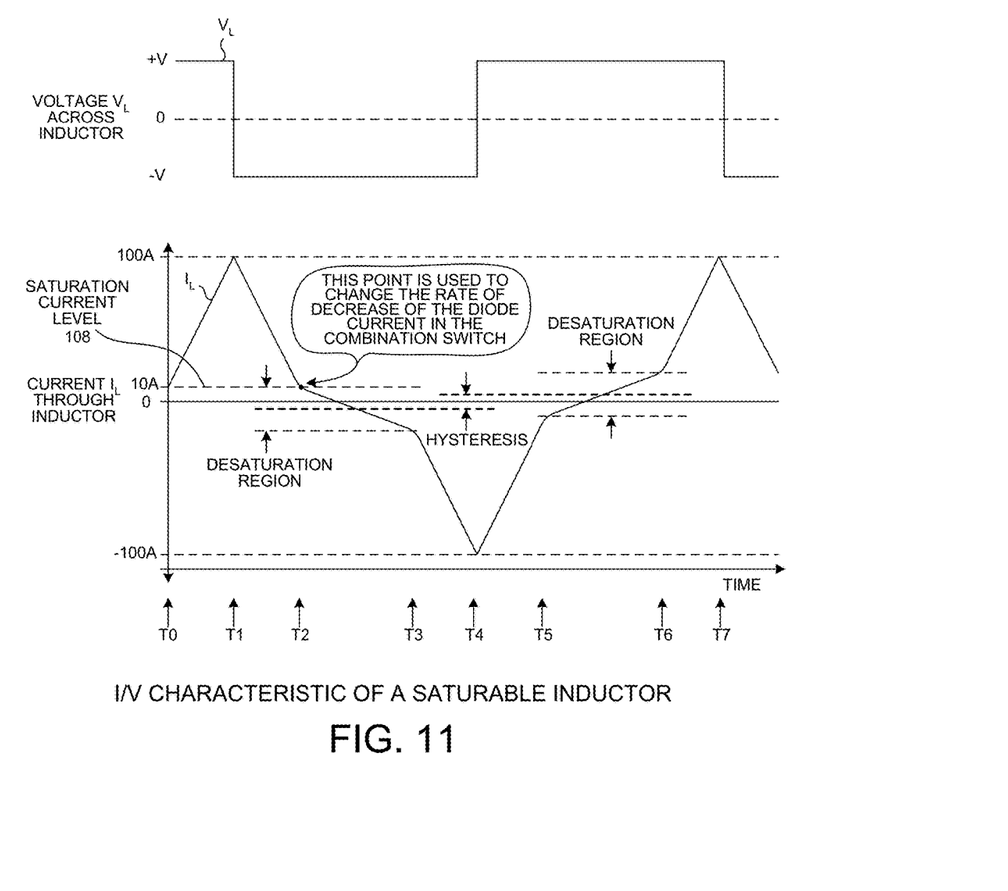
FIG. 11 is a waveform diagram that illustrates the relationship of current flow through the inductor of FIG. 10 to voltage across the inductor of FIG. 10.

FIG. 11 is a waveform diagram that illustrates the relationship of a current $I_L$ passing through the inductor via conductor 106 when a voltage $V_L$ is disposed across the inductor. From time T0 to time T1, and from time T4 to time T7 the voltage $V_L$ across the inductor is +V. From time T1 to time T4 and from time T7 onward the voltage VL across the inductor is –V. As indicated in the lower waveform, the current $I_L$ decreases from time T1 to time T2 at a higher rate of change. At time T2 the current level has decreased to a lower current level such that the ferromagnetic material 107 comes out of saturation. The inductance of the inductor increases, so the subsequent decline in current $I_L$ occurs with a smaller rate of change. At time T3 the current is large enough in the opposite direction that the ferromagnetic material goes into saturation. The inductance of the inductor decreases, so the subsequent decline in current $I_L$ from time T3 to T4 occurs with a higher rate of change. At time T4 the voltage $V_L$ across the inductor is reversed. The current increases at the high rate until the inductor comes out of saturation at time T5. Due to a hysteresis quality of the ferromagnetic material, the current level at which the inductor comes out of saturation at time T5 is higher than the current level at which the inductor went into saturation at time T3. Due to the increased inductance of the desaturated inductor, the rate of increase of the current $I_L$ from time T5 to time T6 occurs at a smaller rate of change. At time T6 the inductor is again saturated. Note that the current level at which the inductor goes into saturation at time T6 is higher than the current level at which the inductor comes out of saturation at time T2. After time T6 to time T7 the current increases at a higher rate due to the reduced inductance of the saturated inductor.

The diagram of FIG. 11 is a simplified waveform diagram and the inductor illustrated in FIG. 10 is a simplified ideal abstract inductor, but the principle of an inductor coming out of saturation (such as at time T2 in FIG. 11) is utilized in the operation of the novel combination switch of FIG. 4 to accomplish the "soft landing" operation. The IGBT is rated to be able to conduct a maximum continuous collector-to-emitter current. The components of the combination switch of FIG. 4 are selected such that the saturation current level 108 at which the saturable inductor 53 comes out of saturation (under conditions of a decreasing diode forward conduction current) is a current level close to zero amperes and well below the maximum continuous collector-to-emitter current. In the example of FIG. 4, the maximum continuous collector-to-emitter current is one hundred amperes, the saturation current level 108 at which the saturable inductor 53 comes out of saturation (for a decreasing diode forward conduction current from the collector node to the emitter node) is ten amperes, and the unsaturated inductance of saturable inductor 53 is at least 200 nH. Although this ten ampere number is appropriate for the illustrated specific embodiment, in other embodiments the saturation current level 108 can be another current that is close to zero amperes, and even may be a slightly negative current. Soft landing advantages are obtained without precise control of the saturation current level 108 and soft landing advantages are obtained even if the saturation current level 108 is a negative current.

Figure 12:
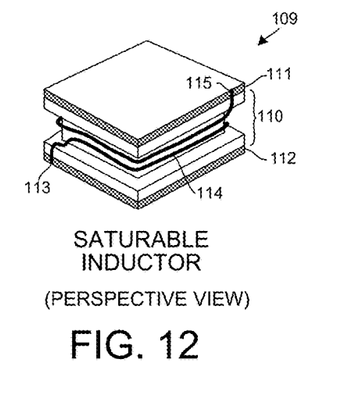
FIG. 12 is a perspective diagram of a first implementation of the saturable inductor of the combination switch of FIG. 4.

There are numerous ways of implementing a suitable saturable inductor 53. FIG. 12 is a perspective view of a first implementation. In the case of FIG. 12, saturable inductor 53 is a surface mount wound inductor structure 109. Inductor structure 109 includes a rectangular block of ferromagnetic material 110 such as ferrite. Disposed on the upper planar side of block 110 is a conductive layer 111. Disposed on the bottom planar side of block 110 is a conductive layer 112. A first end of a conductive wire 114 is coupled to layer 112. A second end 115 of the conductive wire 114 is coupled to layer 111. One or more turns of the conductive wire is wrapped around the ferrite material in a peripheral channel in block 110 as illustrated.

Figure 13:
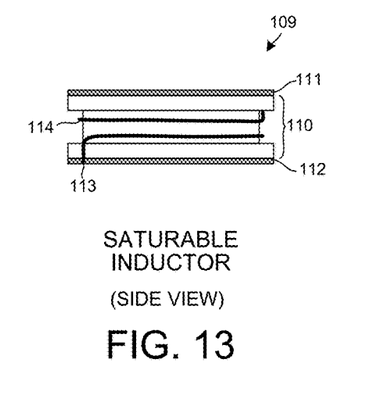
FIG. 13 is side view of the implementation of FIG. 12.

FIG. 13 is a side view of the inductor structure 109 of FIG. 12.

Figure 14:
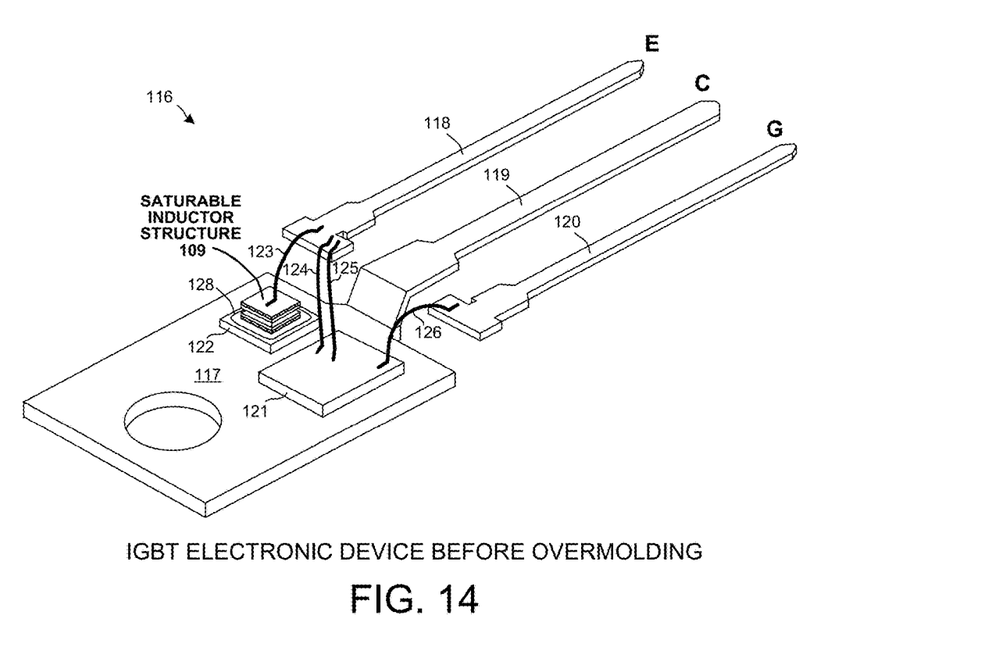
FIG. 14 is a perspective view of an IGBT electronic device before overmolding, where the IGBT electronic device includes the combination switch of FIG. 4, and where the saturable inductor of the combination switch is the implementation of FIG. 12.

FIG. 14 is a perspective diagram of a first example of a partial electronic device assembly 116 involving combination switch, where the combination switch is the combination switch 50 of FIG. 4. Electronic device assembly 116 includes a stamped metal lead frame structure having a central heat sink portion 117, an emitter lead 118, a collector lead 119, and a gate lead 120, an IGBT integrated circuit chip 121 (a form of IGBT 51 of FIG. 4), a Fast Recovery Diode (FRD) diode integrated circuit chip 122 (a form of diode 52 of FIG. 4), a set of bond wires 123-126, and a saturable inductor structure 109. The term "integrated circuit" as it is used here in its general usage includes (but is not limited to) a single semiconductor device such as a single IGBT or a single diode realized on a single semiconductor die. The heat sink portion 117 and leads 118-120 are parts of a single stamped copper leadframe of a TO-247 package. Collector lead 119 is an extension of heat sink portion 117. IGBT 51 and diode 122 are directly solder-mounted to heat sink portion 117. Cutaway portions of the leadframe that hold the leads 118 and 120 to the central collector lead 119 during the assembly process are not shown. Saturable inductor structure 109 is of the form illustrated in FIGS. 12 and 13. The upper planar surface of diode 122 has a plurality of concentric guard rings 128 that extend around the outer edges of the upper surface of diode 122. The bottom conductive layer of the saturable inductor structure 109 is solder-mounted to or otherwise coupled to the upper surface of the diode 122 such that the bottom layer of the inductor does not overlay these guard rings 128 but rather such that the joint between inductor structure 109 and the diode 122 is disposed entirely within the confines of these guard rings 128. One end of bond wire 123 attaches to the upper conductive layer of inductor structure 109 and the other end of bond wire 123 attaches to emitter lead 118. In the present example, bond wire 123 is an aluminum bond wire that is at least four mils (four one thousandths of an inch) in diameter. Although the inductor structure 109 of FIG. 12 is shown disposed on the diode 122 in FIG. 14, another inductor structure may be used such as, for example, a surface-mountable toroidal inductor structure that has conductive upper and bottom layers 111 and 112.

Figure 15:
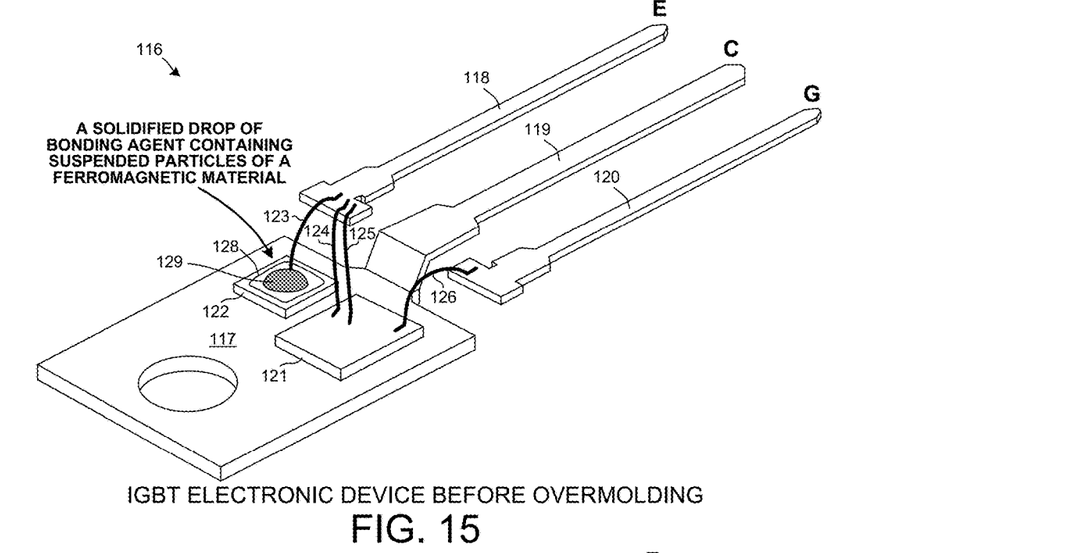
FIG. 15 is a perspective view of an IGBT electronic device before overmolding, where the IGBT electronic device includes the combination switch of FIG. 4, and where the saturable inductor of the combination switch involves a volume of a bonding agent that has ferromagnetic particles suspended in it.

FIG. 15 is a perspective diagram of a second example of the partial electronic device assembly 116 involving a combination switch, wherein the combination switch is the combination switch 50 of FIG. 4. The structure of the assembly illustrated in FIG. 15 is the same as the structure of the assembly illustrated in FIG. 15, except that saturable inductor 53 of the combination switch is a second implementation. In the example of FIG. 15, saturable inductor 53 involves a volume 129 of a bonding agent that has ferromagnetic particles suspended in it. The ferromagnetic particles may, for example, be particles of a suitable soft ferrite material. The bonding agent may, for example, be a volume of thermoplastic resin or adhesive polymer or epoxy or adhesive that holds approximately one or more cubic millimeters of soft ferrite particles. The volume of bonding agent containing the ferromagnetic particles is applied in liquid form as a drop so that the drop-like form surrounds a portion of the bond wire 123 where the bond wire attaches to a bond pad on the upper surface of diode chip 122 as shown. The bond wire 123 is an aluminum bond wire that is at least four mils (four one thousandths of an inch) in diameter. The liquid bonding agent containing the soft ferrite particles is not a thin layer that covers the entire upper exposed surface of assembly 116 but rather is a small volume of liquid applied in a localized manner as illustrated in FIG. 15. The location of deposit and the amount of liquid deposited are both controlled. Once deposited, the liquid bonding agent solidifies so that it holds the ferromagnetic particles in place with respect to the bond wire 123, thereby forming the finished inductor structure. The bond wire 123 extends through the volume of bonding agent such that in a cross-sectional view of the bond wire there is bonding agent in contact with the entire circular periphery of the bond wire. In one example, the volume of the liquid (bonding agent and ferromagnetic particles) is placed such that the boundary where the drop-like form meets to the upper surface of diode does not overlap the guard rings 128 of the diode die 122. The liquid, however, surrounds the location where the bond wire 123 attaches to the top of diode die 122.

Figure 16:
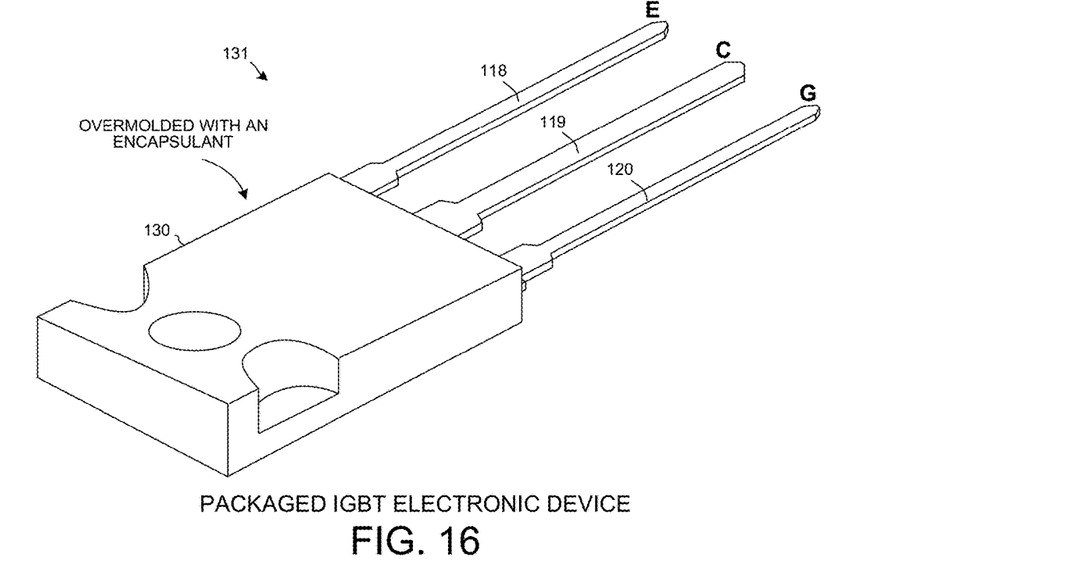
FIG. 16 is a perspective view of a packaged IGBT electronic device that includes the novel combination switch of FIG. 4.

FIG. 16 is a perspective view of the electronic device assembly of FIG. 14 or FIG. 15 after it has been overmolded with an amount of suitable conformal encapsulant to form a finished packaged electronic device 131. The amount of encapsulant that overmolds the IGBT, the diode, the inductor, and the bond wires forms a body portion or case 130. Various different types and combinations of different types of encapsulants can be used. The bottom surface of the metal heat sink portion 117 can be left exposed on the underside of the illustrated packaged electronic device structure. Leads 118-120 extend from the body portion or case 130. Leads 118-120 are also referred to as package terminals.

In some examples, the IGBT and diode integrated circuit dice 121 and 122 are disposed on a thin heat-conductive intervening insulating layer (not shown) that in turn is disposed on heat sink portion 117. The collector lead 119 is not an extension of the heat sink portion 117 but rather is a separate lead. The metal of the heat sink portion 117 is electrically isolated from the IGBT and diode integrated circuits 121 and 122 and from leads 118-120.

Although the method of manufacturing an inductor by depositing an amount of liquid containing ferromagnetic particles is described above in connection with an IGBT circuit, the method of manufacture sees general applicability in the field of electronics. The method is not limited to use in power electronics nor is the amount of deposited ferromagnetic particles restricted to any range or volume. In some examples of the method, a small volume of curable liquid containing ferromagnetic particles is deposited on an electronic device assembly as part of a microdrop of fluid using an automated pick and place assembly device that controls a suitable micro-valve and micro-nozzle. The pick and place assembly device that deposits the microdrop is the same pick and place device that places the other electronic components of the electronic assembly device onto a substrate. The amount of curable liquid deposited by the pick and place machine can be varied from inductor structure to inductor structure where multiple such inductor structures are being fabricated on the same substrate. The conductor that forms a part of the inductor structure need not be a bond wire, but rather can be another type of conductor. The volume of liquid need not be deposited such that the conductor extends through the volume of liquid. In one example, the volume of liquid is deposited to cover a portion of a signal conductor on a substantially planar substrate, or printed circuit board, integrated circuit chip, or other object. The volume of liquid can be deposited in an indentation, hole or trench. In one example, a signal conductor extends around a peripheral rim of a hole so that the solidified liquid disposed in the hole forms a sort of magnetic core. If wire bonding is used in the assembly of the electronic device, then the depositing of the liquid containing the ferromagnetic particles can occur either prior to wire bonding or after wire bonding. The liquid need not be applied in direct contact with the conductor of the inductor, but rather in some embodiments is deposited in the immediate vicinity of the conductor. The conductor of the inductor may, for example, be covered with a thin insulating layer, and the liquid is deposited on the thin insulating layer. The resulting inductor structure can be a part of a transformer where multiple magnetically coupled conductors extend through the same volume of solidified liquid.

Figure 17:
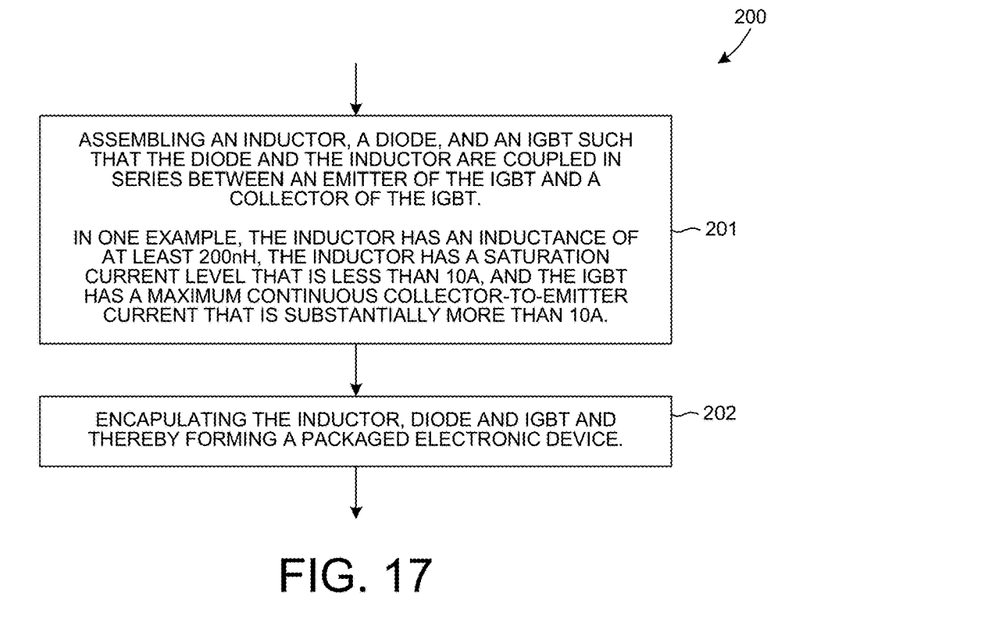
FIG. 17 is a flowchart of a method of manufacturing a packaged electronic device having a saturable inductor and diode coupled in series between the collector and the emitter of an IGBT.

FIG. 17 is a flowchart of a method 200 of manufacturing a packaged electronic device. A first step (step 201) involves assembling an inductor, a diode, and an IGBT such that the diode and the inductor are coupled in series between an emitter of the IGBT and a collector of the IGBT. A second step (step 202) involves encapsulating the inductor, the diode and the IGBT, thereby forming the packaged electronic device.

Figure 18:
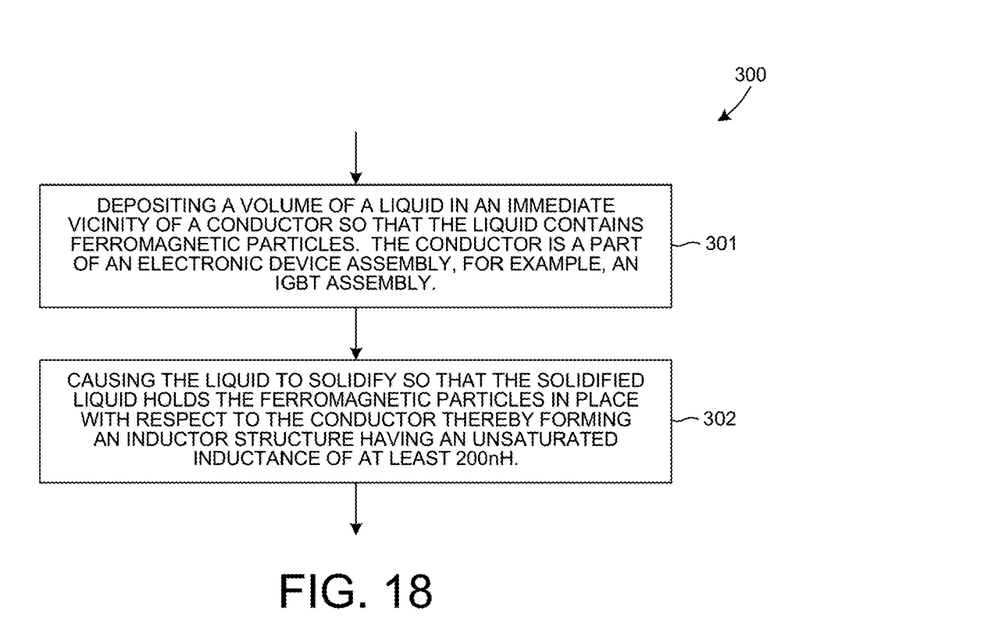
FIG. 18 is a flowchart of a method involving depositing a volume of a liquid containing ferromagnetic particles in the vicinity of a conductor and then causing the liquid to solidify so that the solidified liquid holds the ferromagnetic particles in place with respect to the conductor, thereby forming an inductor structure.

FIG. 18 is a flowchart of a method 300 of manufacturing an inductor structure. A first step (step 301) involves depositing a volume of a liquid in an immediate vicinity of a conductor, where the liquid contains ferromagnetic particles, and where the conductor is a part of an electronic assembly. In one example, the electronic assembly is an IGBT assembly. A second step (302) involves causing the liquid to solidify so that the solidified liquid holds the ferromagnetic particles in place with respect to the conductor thereby forming the inductor structure having an unsaturated inductance of at least 200 nH.

Although certain specific embodiments are described above for instructional purposes, the teachings of this patent document have general applicability and are not limited to the specific embodiments described above. Although the IGBT of the novel combination switch in the example of FIG. 4 is an N-type PT IGBT, the IGBT in other examples is a P-type PT IGBT. Although the use of a saturable inductor to provide a soft landing of a diode recovery current is described above in connection with IGBTs, a saturable inductor can be used to provide a soft landing of a diode recovery current in connection with other types of transistors and switching elements. Accordingly, various modifications, adaptations, and combinations of various features of the described embodiments can be practiced without departing from the scope of the invention as set forth in the claims.

What is claimed is:

1. A method of manufacture comprising:
depositing a volume of a liquid in an immediate vicinity of a conductor, wherein the liquid contains ferromagnetic particles, wherein the conductor is a part of an electronic device assembly;
causing the liquid to solidify so that the conductor and the solidified liquid together form a saturable inductor structure, wherein the saturable inductor structure has an unsaturated inductance of at least 200 nH, wherein the saturable inductor structure has a saturated inductance that is smaller than the unsaturated inductance, and wherein the solidified liquid holds the ferromagnetic particles in place with respect to the conductor; and
assembling the saturable inductor structure, a diode and an insulated-gate bipolar transistor (IGBT) such that the diode and the saturable inductor structure are coupled in series between an emitter of the IGBT and a collector of the IGBT.

2. The method of manufacture of claim 1, further comprising:
overmolding the saturable inductor structure in an amount of an encapsulant along with other parts of the electronic device assembly and thereby forming a packaged electronic device.

3. The method of manufacture of claim 2, wherein the conductor is a bond wire, and wherein the volume of liquid contains at least one cubic millimeter of ferromagnetic particles.

4. The method of manufacture of claim 1, wherein the saturable inductor structure comes out of saturation when a current flow through the saturable inductor structure falls below a saturation current level, and wherein the saturation current level is less than approximately ten amperes.

5. The method of manufacture of claim 1, wherein the conductor is a bond wire that extends through the solidified liquid, and wherein the solidified liquid has a volume of at least one cubic millimeter.

6. The method of manufacture of claim 1, wherein the conductor that makes at least one turn around a portion of the ferromagnetic particles.

7. The method of manufacture of claim 1, further comprising:
encapsulating the saturable inductor structure, the diode and the IGBT and thereby forming a packaged electronic device.

8. The method of manufacture of claim 1, wherein there is no diode whose anode is directly connected to the emitter and whose cathode is directly connected to the collector.

9. A method of manufacture comprising:
depositing a volume of a liquid in an immediate vicinity of a conductor, wherein the liquid contains ferromagnetic particles;
causing the liquid to solidify so that the conductor and the solidified liquid together form a saturable inductor, wherein the saturable inductor has a saturated inductance and an unsaturated inductance, wherein the saturated inductance is smaller than the unsaturated inductance, and wherein the solidified liquid holds the ferromagnetic particles in place with respect to the conductor; and assembling the saturable inductor, a diode and an insulated-gate bipolar transistor (IGBT) such that the diode and the saturable inductor are coupled in series between an emitter of the IGBT and a collector of the IGBT.

10. The method of manufacture of claim 9, wherein there is no diode whose anode is directly connected to the emitter and whose cathode is directly connected to the collector.

11. The method of manufacture of claim 9, wherein the unsaturated inductance of the saturable inductor is at least 200 nH.

12. The method of manufacture of claim 9, wherein the IGBT is a punch through insulated gate bipolar transistor (PT IGBT).

13. The method of manufacture of claim 9, wherein the diode is a fast recovery diode.

14. The method of manufacture of claim 9, wherein the saturable inductor is a toroidal inductor.

15. The method of manufacture of claim 9, wherein the diode has a substantially planar upper surface, wherein the saturable inductor has a substantially planar surface, and wherein the assembling involves mounting the substantially planar surface of the saturable inductor to the substantially planar upper surface of the diode.

16. A method of manufacture comprising:

depositing a volume of ferromagnetic material in an immediate vicinity of a conductor, wherein the ferromagnetic material is liquid during the depositing;

causing the ferromagnetic material to solidify so that the conductor and the ferromagnetic material together form a saturable inductor, wherein the saturable inductor has a saturated inductance and an unsaturated inductance, and wherein the saturated inductance is smaller than the unsaturated inductance; and assembling the saturable inductor, a diode and a punch through insulated-gate bipolar transistor (PT IGBT) such that the diode and the saturable inductor are coupled in series between an emitter of the PT IGBT and a collector of the PT IGBT.

17. The method of manufacture of claim 16, wherein there is no diode whose anode is directly connected to the emitter and whose cathode is directly connected to the collector.

18. The method of manufacture of claim 16, wherein the unsaturated inductance of the saturable inductor is at least 200 nH.

19. The method of manufacture of claim 16, wherein the diode is a fast recovery diode.

* * * * *